United States Patent [19]

Wilkinson

[11] 4,447,902

[45] May 8, 1984

[54] ERROR-CORRECTION FORMAT FOR DIGITAL TELEVISION SIGNALS

[75] Inventor: James H. Wilkinson, Tadley, United Kingdom

[73] Assignee: Sony Corporation, Tokyo, Japan

[21] Appl. No.: 359,996

[22] Filed: Mar. 19, 1982

[30] Foreign Application Priority Data

Mar. 23, 1981 [GB] United Kingdom ................. 8108998

[51] Int. Cl.³ .............................................. G06F 11/10
[52] U.S. Cl. ......................................... 371/39; 371/37
[58] Field of Search ......................... 371/37, 38, 39, 40

[56] References Cited

U.S. PATENT DOCUMENTS 4,330,860 5/1982 Wada et al. .............................. 371/37
4,394,762 7/1983 Nabeshima ............................. 371/38

OTHER PUBLICATIONS

E. R. Berlekamp, Algebraic Coding Theory, McGraw-Hill, Inc., 1968, pp. 347–349.

Primary Examiner—Charles E. Atkinson
Attorney, Agent, or Firm—Lewis H. Eslinger; Alvin Sinderbrand

[57] ABSTRACT

An error-correction format for transmitting digital television signals comprises segments of data, which segments may for example represent 48 successive horizontal lines of a television field. The segment comprises, for example, data groups n to n+23 and a final group n+24 which forms a vertical parity check group. Each of the data groups n to n+23 comprises m blocks, and each block comprises a synchronization and address sub-block followed by s data sub-blocks, each data sub-block being followed by respective inner code protection bits for providing error protection for the immediately preceding data sub-block, and finally followed by a cyclic redundancy check code for providing error protection for the s data sub-blocks in the block. The vertical parity group n+24 is just the same in format as the other groups n to n+23, but each sub-block thereof is made up of vertical parity check words which form an outer error correcting code in place of data words.

10 Claims, 7 Drawing Figures

ERROR-CORRECTION FORMAT FOR DIGITAL TELEVISION SIGNALS

BACKGROUND OF THE INVENTION

1. Field of the Invention

This invention relates to digital television signal processing and more particularly to methods and apparatuses for transmitting digital television signals in an error-correction format.

2. Description of the Prior Art

There are two main approaches to dealing with errors in digital television signals. The first approach is correction, which involves the production and use of additional data signals purely for the purpose of error detection and correction, these additional data signals otherwise being redundant. The second approach is concealment, which involves additional data signals for detection of errors only, followed by the reconstruction of corrupted data signals using available uncorrupted data signals and relying for accuracy on the strong correlation that exists in a television signal not only in the horizontal and vertical dimensions but also temporally.

Clearly, error correction is potentially the better method of dealing with errors. However, there are difficulties. Firstly, for a reasonable level of protection from errors which escape correction, a high level of redundancy is required. Incidentally, the redundancy level is typically expressed in percentage terms, that is, the number of redundant bits as a percentage of the total number of bits. Secondly, there is some risk of wrong correction, that is, where a valid bit is wrongly changed to the other binary value. Error correction codes for use with binary data are of course well known, but the error rates which can occur in a digital television signal, due for example to drop-out on reproducing from a magnetic tape, are very high, and in these circumstances some of the known error correction codes can actually have the effect of increasing the number of errors.

A digital television signal is normally organised into blocks of data, each block comprising both information bits and redundant bits. Error detection is a means by which the redundant bits are used to indicate the occurrence of one or more errors within a given data block. The indication can only be one of two possibilities; that is, the block has errors or it does not have errors. All usable methods of error detection will detect one error in a block, and the performance of the method is defined by the detection capability for multiple errors. In a video tape recorder (VTR), three forms of multiple error occur, these being:

(i) errors caused by noise
(ii) interchannel cross-talk, which is sometimes caused by poor tracking when a VTR is operating in the normal reproduction mode, but it is particularly liable to occur when a VTR is operating in a special mode, such as slow motion, fast motion, stop motion or reverse motion; and
(iii) drop-out, which may cause total loss of reproduced data for a considerable length of time.

Moreover, particularly with digital VTRs for broadcast use, it is common for a video signal to pass through many generations of recording and reproduction. This demands a superlative first generation picture. For this reason there is still a strong demand for better methods of and apparatuses for error correction. And while it is recognised that any correction method will fail from time to time and then concealment will be required, this should preferably only occur in extreme circumstances.

SUMMARY OF THE INVENTION

One object of the present invention is to provide an improved method of and apparatus for error correction of a digital television signal.

Another object of the present invention is to provide a method of transmitting digital television signals with two error correcting codes and an error detecting code.

Another object of the present invention is to provide a decoder for effecting correction of a digital television signal in dependence on first and second error correcting codes and an error detecting code.

According to the present invention there is provided a method of transmitting digital television signals comprising the steps of:

forming data words representing a digital television signal into successive data segments, each data segment comprising a plurality of data blocks, each data block comprising a plurality of data sub-blocks, and each data sub-block comprising a plurality of data words;

generating a respective first error correcting code for each data sub-block for use in correcting at least one bit which may be in error in the data sub-block;

generating a respective error detecting code for each data block for use in detecting whether the first error correcting code has been successful in correcting all errors in the respective data block;

generating a respective second error correcting code for each data segment for use in correcting at least one data word which may be in error in the data segment; and combining the first and second error correcting codes and the error detecting code into the respective data segments for transmission of the digital television signal.

Transmission of the digital television signal may merely comprise transmission to the recording head assembly of a digital recorder such as a digital VTR for recording on a suitable recording medium for subsequent reproduction. The subsequent reproduction need not of course be on the same machine and as will be discussed in more detail below when describing a specific embodiment, it is not necessary when reproducing to make full or indeed any use of the error correcting codes and the error detecting code. The situation is analogous to that in the field of audio signal recording where it is usual to record signals to a very high standard. The quality of reproduction is therefore determined in most cases by the limitations of the reproducing apparatus used. In the present case, therefore, if the reproduction is for broadcast use and most especially if it is part of a multiple generation recording and reproduction sequence the correction and detection codes will be used to the full. In a less critical situation, however, then the second error correcting code can simply be ignored on reproduction. Indeed, in some cases it may not even be recorded. As any data words identified as remaining in error after the previous error correction and detection steps will be suitably flagged to indicate this, any such flagged data words will simply be concealed, rather than a further effort being made to correct them using the second error correcting code.

Preferably the first error correcting code is assembled with and forms part of the respective data sub-block for transmission, the error detecting code is assembled with and forms part of the respective data block for transmission, and the second error correcting code is assembled with and forms part of the respective data segment for transmission. Preferably also the format of the second error correcting code is the same as that of the data words in the data block and the second error correcting code block contains respective first error correcting codes and a respective error detecting code.

The first and second error correcting code and the error detecting code can each take any one of a variety of forms. By way of example only, the first error correcting code may be a form of modified Hamming code, such as a so-called b-adjacent code, the error detecting code may be a cyclic redundancy check (CRC) code, and the second error correcting code may be a parity check code. Moreover, although the minimum requirement is that the first and second error correcting codes each have the capability of actually correcting at least some of the errors detected, and the error detecting code has the capability of at least detecting some of the errors remaining after operation of the first error correcting code, it is also possible for the error detecting code additionally to have an error correction capability so as in fact to be a third error correcting code.

According to the present invention there is also provided an error correction encoder for digital television signals, the encoder comprising:

means for forming data words representing a digital television signal into successive data segments, each data segment comprising a plurality of data blocks, each data block comprising a plurality of data sub-blocks, and each data sub-block comprising a plurality of the data words;

first error correcting code means for generating a respective first error correcting code for each data sub-block for use in correcting at least one bit which may be in error in the data sub-block;

error detecting code means for generating a respective error detecting code for each data block for use in detecting whether the first error correcting code has been successful in correcting all errors in the respective data block;

second error correcting code means for generating a respective second error correcting code for each data segment for use in correcting at least one data word which may be in error in the data segment; and means for combining the first and second error correcting codes and the error detecting code into the respective data segments for transmission of the digital television signal.

Although, as indicated above, the full error detection and error correction capabilities of the format need not always be used on decoding, there will be cases, for example in broadcast use, where they are used, and in such a case an error correction decoder may comprise:

means for receiving the transmitted digital television signal;

first means operative in dependence on the respective first error correcting code for correcting at least one bit error in the data sub-block and for flagging that a correction has been attempted;

second means operative in dependence on the error detecting code for detecting any errors remaining in the respective data block after operation of the first means, for flagging the remaining errors, and if no errors remain, for cancelling flags set by the first means; and third means operative in dependence on the second error correcting code for correcting at least one data word error remaining in the data segment, after operation of the second means.

A particular problem with previously-proposed methods of error correction is that the ability to correct multiple-bit errors, resulting for example from tape drop-out, is often impaired due to the presence of random 1-bit errors. In many cases, embodiments of the invention will be effective to correct at least some of these 1-bit errors with consequent substantially improved overall error correction.

The above, and other objects, features and advantages of this invention will be apparent from the following detailed description of illustrative embodiments thereon which is to be read in connection with the accompanying drawings.

DESCRIPTION OF THE PREFERRED EMBODIMENTS

Figure 1:
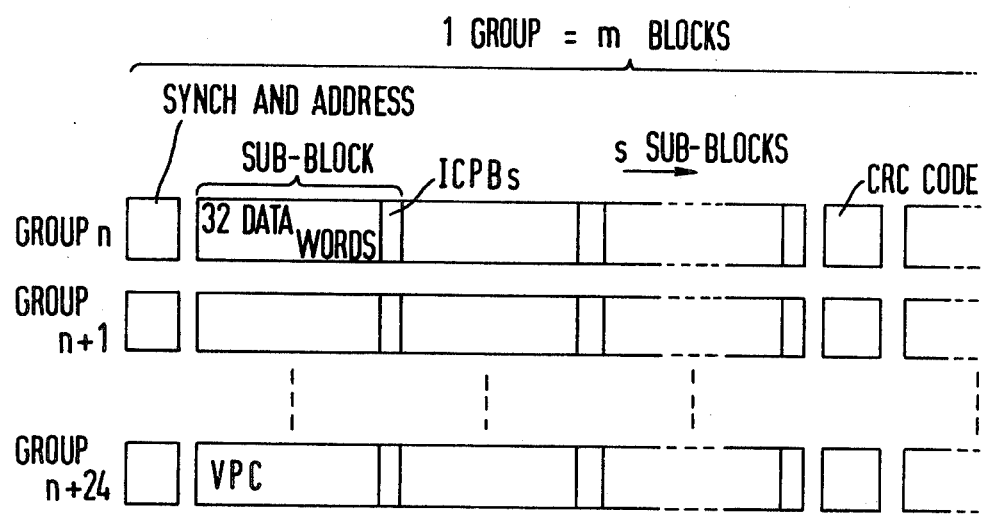
FIG. 1 shows diagrammatically a coding format used in a method according to the invention.

FIG. 1 shows a coding format applied to a digital television signal. Each horizontal line scan of an incoming analog television signal has, as a preliminary, been sampled a predetermined number of times, for example, 512 times, per horizontal line, and each of the resulting samples has been pulse code modulation coded into an 8-bit data word. The part of the format shown in FIG. 1 covers a segment of data, which segment may, for example, represent 48 successive lines of a television field. The segment comprises 24 groups, the groups being numbered from group n to group n+24, and each group being represented by one line in the figure. The groups n to n+23 are data groups and the group n+24 is a vertical parity check (VPC) group.

Each of the groups n to n+23 comprises m blocks, and each block comprises a synchronisation and address sub-block followed by s data sub-blocks, each data sub-block being followed by respective inner code protection bits (ICPBs) for providing error protection for the immediately preceding data sub-block, and finally followed by a cyclic redundancy check (CRC) code for providing error protection for the s data sub-blocks in the block. The VPC group n+24 is just the same in format, but each sub-block is made up of VPC words which form an outer code, in place of data words. In the particular example to be described there are 32 8-bit words in each sub-block, 2 8-bit words forming ICPBs for each sub-block, and 32 CRC code bits in each block.

While for simplicity it may be considered that successive data words in a data sub-block represent successive samples along a horizontal line scan of a television signal, in practice this is unlikely to be the case. The reason is that if one data word is in error there is a greater than average probability of the immediately adjacent data words also being in error, as occurs for example in a burst error. Indeed it is not uncommon for error correction and concealment arrangements to operate on the assumption that a small number of other data words corresponding to samples adjacent to a sample the data word for which has been found to be in error are also in error, even although those other data words have not specifically been identified as being in error. The chances of concealing such errors are substantially improved by dispersing them and it has therefore been previously proposed that after sampling the analog television signal and coding the samples, the resulting data words should be shuffled in order, for example using a random access memory (RAM) arrangement. Then, prior to decoding the data words, their order is unshuffled using a complementary RAM arrangement.

Another previously proposed technique for improving error correction is interleaving, and that technique can also be used in error correction formats according to the invention. The effect of interleaving is to spread errors so that if a burst of errors occurs there is a greater probability of each of the individual errors being corrected.

The inner code can be any one of a number of known error correction codes, and in the particular example to be described is a variation of the Hamming code known as a b-adjacent code and which is described in "b-Adjacent Error Correction" by D. C. Bossen in IBM Journal of Research and Development, July 1970, pages 404 and 405. Each sub-block contains 272 bits including 16 check bits, and the check bits are capable of correcting up to b bit errors in the sub-block. In this case b is equal to 8.

Other examples of error correcting codes which can be used as the inner code are the original version of the Hamming code or the cyclic version thereof; the Burton code; the Fire code; the Bose-Chaudhuri-Hocqeghem code; the Reed-Solomon code; or a suitable rectangular, triangular, cubic or n-dimensional code.

The inner code is used, for example after the digital television signal has been recorded on and reproduced from a digital VTR, to detect and correct errors in the associated data sub-block. Data words which are detected as being in error are flagged and the error flags are left even when correction has been effected.

When the errors in all s sub-blocks of a data block have, so far as possible, been corrected using the inner code, the CRC code is applied to all the data words in the block. If the CRC is valid, then any correction made is taken to be good and all the error flags are cancelled. If on the other hand the CRC is not valid, then three possibilities exist:

(i) if the inner code has not effected corrections in any of the sub-blocks, then it is assumed that an undetectable error has occurred, so an error flag is attached to all the data words in the block signifying the need for subsequent vertical parity correction or for concealment.

(ii) if the inner code has effected a correction in only one sub-block, it is assumed that only this sub-block is in error and error flags are attached to all the data words in that sub-block signifying the need for subsequent vertical parity correction or for concealment.

(iii) if the inner code has effected corrections in two or more sub-blocks, it is assumed that there has been a drop-out and error flags are attached to all the data words in the block signifying the need for subsequent vertical parity correction or for concealment.

As with the inner code, the CRC code can be replaced by some suitable alternative form of code such as a modulo-$2^{32}$ addition. Moreover, although the CRC code is purely an error detecting code, it is possible to associate with each data block a suitable error correcting code, that is to say a code which, like the inner code, has both error detecting and error correcting capabilities.

Finally, after the inner code and the CRC code have been applied to each group in the segment, including group n+24 which comprises the VPC code, the VPC code is applied to the data words of the data groups n to n+23. Each word of the VPC code is formed by the modulo-2 addition of the 24 data words in the same corresponding position in each of the data groups n to n+23. If on applying the VPC code to 24 such data words, a single one of these data words has an error flag, then the remaining 23 data words and the VPC code word are modulo-2 added to form a so-called syndrome which is then modulo-2 added to the word in error to correct that word. In this case therefore the error flag attached to that word can be cancelled. On the other hand, if two or more of the data words have error flags, then the VPC code is not capable of effecting correction and the error flags are left. At the next stage therefore a concealment technique is used to conceal, that is to say replace with locally-generated data words, all those data words to which error flags remain attached.

Figure 2:
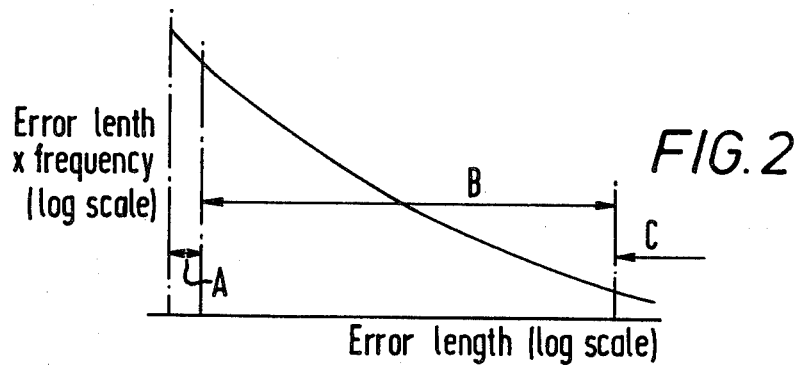
FIG. 2 is a graph plotting error length times frequency against error length.

It will be appreciated that the use of such an error correction format is particularly effective because the inner code will remove, for example, many random 1-bit errors, and will consequently substantially increase the probability of the outer code being effective to correct remaining data word errors. This is illustrated in FIG. 2, in which the ordinates represent error length times frequency on a log scale and the abscissae represent error length on a log scale. The curve shown is typical for a digital television signal which has been recorded on and reproduced from a digital VTR. With the error correction format described, errors within the region A are correctable by the inner code, errors within the region B are correctable by the outer code, and errors within the region C are not correctable but must be concealed. In the absence of the inner code correction, the region B would be substantially less wide and in consequence far more errors would have to be concealed.

The digital television signal in the error correction format described above can be transmitted, recorded, reproduced or otherwise handled in serial or parallel form.

In the foregoing description it has been assumed that the error correction format is recorded in full and that on reproduction the error correction capabilities of the format are used to the full. However, this need not be the case. In all methods according to the invention the full error correction format as described above and comprising a first error correcting code, in this case the inner code, an error detecting code, in this case the CRC code, and a second error correcting code, in this case the VPC is formed, but it is not even necessary for the complete format to be recorded, although it is preferable that it should be, so that in all cases the recording format is standard. If the VPC is not recorded then it is necessary to indicate this in the recorded signal, for example by suitable addressing or by recording a code word or a recognisable pattern of bits in the VPC group, so that the absence of the VPC can be detected on reproduction.

Assuming that the complete format is recorded, then on reproduction several possibilities exist. For example, the VPC may not be used, in which case none of the error flags remaining after the CRC will be cancelled, and all the data words having such error flags attached will go for concealment. This may occur in a relatively simple machine which has no capacity for VPC error correction, but it may also happen in a more sophisticated machine if that machine is being used in a special mode. Thus, for example, if reproduction is taking place in a fast motion mode, the reproducing heads will almost certainly be jumping from one recording track to another and there is substantially no chance of a segment being reproduced in sufficiently complete form for the VPC to have any validity.

Another alternative is to use the inner code and/or the CRC code solely to flag data words which are found by the inner code to be in error. Data words so flagged then go for concealment.

A further alternative is to use the inner code to detect and where possible to correct errors, and also to attach error flags to data words found to be in error. The CRC code is then used to check the resulting data words, whereupon the error flags are cancelled, or alternatively, the error flags are attached to all the data words in the block, depending on the result of the CRC. Here it should be mentioned that the 32-bit CRC code has a very high degree of security. For a random noise input, detection failure is 1 in $2^{-32}$ (or 2.3 times $10^{-10}$) and this is, for all practical purposes perfect detection.

Obviously the specific numbers mentioned above can be varied. That is to say, the number of bits in a word, words in a sub-block, sub-blocks in a block, blocks in a group and groups in a segment can be varied as required to suit particular circumstances, and in particular to obtain a desired compromise between the degree of error protection and the redundancy. In particular it should be mentioned that although in FIG. 1 there are a plurality of blocks in a group, it is nevertheless possible to have a complete error correction format in accordance with the invention in cases where there is only block in a group and in such a case, if the same amount of data is to be included in each segment, then this can still be achieved by increasing the number of groups in the segment.

Having described the error correction format in detail, an encoder for generating the format and a decoder for effecting error correction will now be described.

Figure 3:
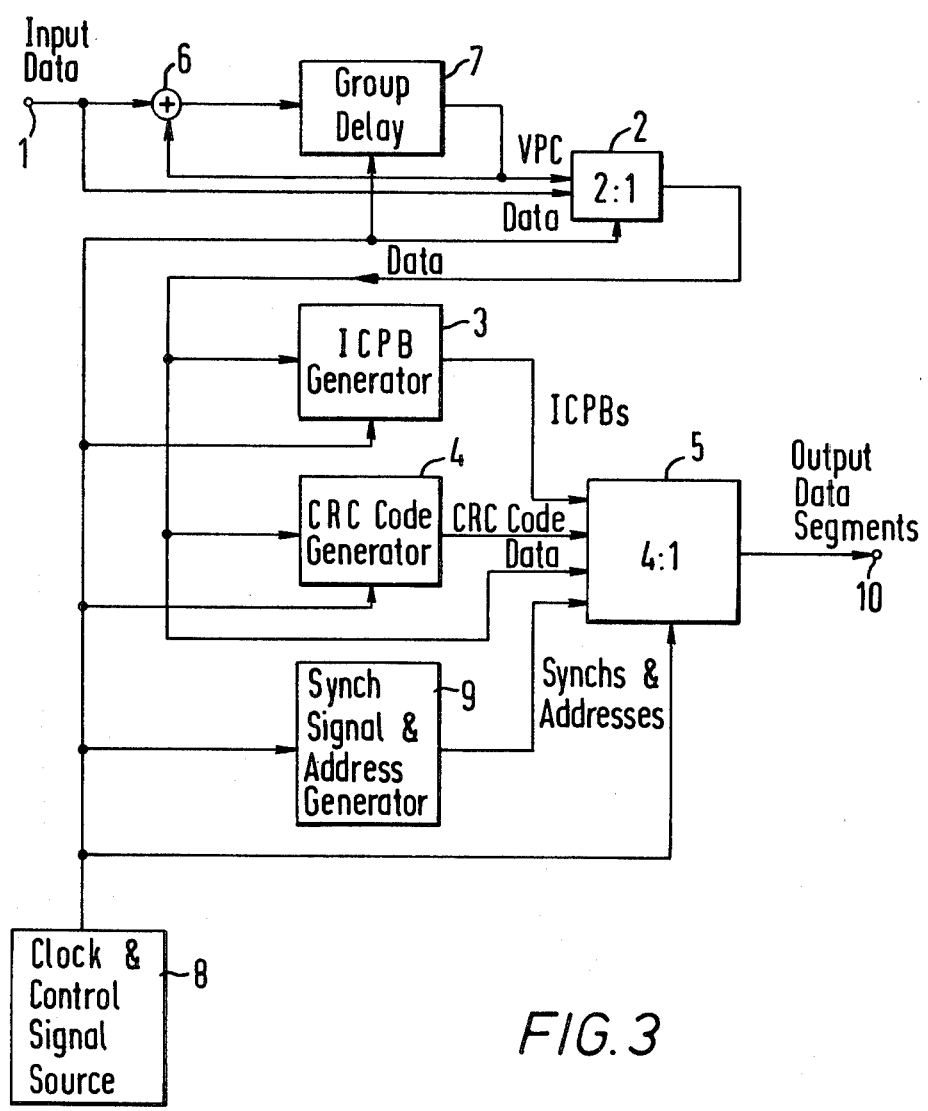
FIG. 3 is a block diagram of an embodiment of an encoder according to the invention.

Reference will first be made to FIG. 3 which shows an encoder in block form. The encoder comprises an input terminal 1 which is connected to one input terminal of a 2:1 selector 2, the output of which is connected to data inputs of an ICPB generator 3 and a CRC code generator 4, and to one input of a 4:1 selector 5. The input terminal 1 is also connected to one input of an exclusive-OR device 6, the output of which is connected to a group delay device 7. The group delay device 7 has an output connected to the second input of the selector 2 and also to a second input of the exclusive-OR device 6. Outputs of the ICPB generator 3 and the CRC code generator 4 are connected to second and third inputs of the selector 5. A clock and control signal source 8 supplies clock signals and control signals to control inputs of the ICPB generator 3, the CRC code generator 4 and the group delay device 7, and also to a synchronising signal and address generator 9. The output of the synchronizing signal and address generator 9 is connected to the fourth input of the selector 5, the output of which is connected to an output terminal 10. The selectors 2 and 5 are controlled by selection control signals supplied from the clock and control signal source 8.

In operation, data which is already in the correct time format, that is to say as shown in FIG. 1, is supplied to the input terminal 1. The operation is such that on supply by the selector 2 of each data sub-block, the ICPB generator 3 operates to generate in dependence thereon the ICPBs which are supplied to the selector 5. Likewise the CRC code generator 4 operates in dependence on each block to generate the CRC code which is supplied to the selector 5. The synchronizing signal and address generator 9 generates synchronizing signals and addresses at the appropriate times and these also are supplied to the selector 5. Meantime, the group delay device 7 and the exclusive-OR device 6 cooperate to modulo-2 add the bits in corresponding positions in each successive group so that after 23 such additions the VPC code is supplied to the selector 2 and thence to the ICPB generator 3 and the CRC code generator 4 to be treated therein just like an ordinary data block. The selector 5 is controlled to pass signals from the inputs thereof to the output terminal 10 in the correct time sequence so that the synchronizing signal and addresses, ICPBs, CRC code and the data (which in this case includes the VPC code) are passed to the output terminal 10 in the correct time sequence to form the required continuous output signal. Again, it should be mentioned that this whole operation can be serially bit-by-bit or in parallel word-by-word.

Figure 4:
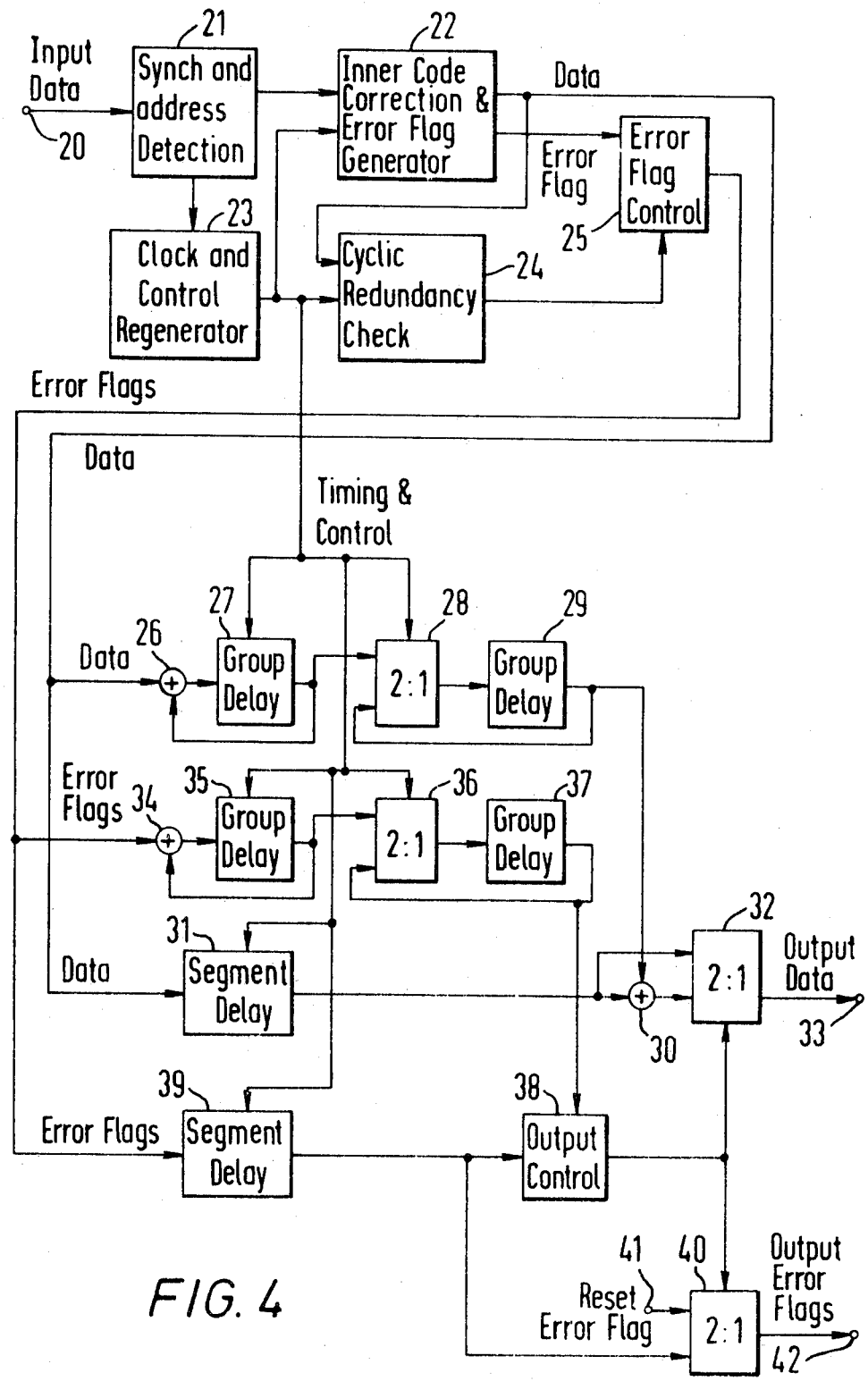
FIG. 4 is a block diagram of an embodiment of a decoder for use with the encoder of FIG. 3.

Reference will now be made to FIG. 4 which shows a decoder in block form. The decoder comprises an input terminal 20 which is conected to a synchronizing signal location and address detection device 21 which supplies output data to an inner code correction and error flag generator 22, and synchronizing signals and addresses to a clock and control signal generator 23. Output data from the inner code correction and error flag generator 22 are supplied to an input of a CRC device 25. Error flag outputs from the inner code correction and error flag generator 22 and the CRC device 24 are supplied to an error flag control device 25.

Output data from the inner code correction and error flag generator 22 are also supplied to one input of an exclusive-OR device 26, the output of which is connected to a group delay device 27. The output of the group delay device 27 is connected to one input of a 2:1 selector 28 and also to the other input of the exclusive-OR device 26. The output of the selector 28 is connected to a group delay device 29, the output of which is connected to the other input of the selector 28 and also to one input of an exclusive-OR device 30.

Output data from the inner code correction and error flag generator 22 are also supplied to a segment delay device 31, the output of which is connected to the other input of the exclusive-OR device 30 and to one input of a 2:1 selector 32. The output of the exclusive-OR device 30 is connected to the other input of the selector 32, the output of which is connected to an output terminal 33 from which the output data is derived.

Error flags from the error flag control device 25 are supplied to one input of an exclusive-OR device 34, the output of which is connected to a group delay device 35. The output of the group delay device 35 is connected to one input of a 2:1 selector 36 and also to the second input of the exclusive-OR device 34. The output of the selector 36 is connected to a group delay device 37, the output of which is connected to the second input of the selector 36 and also to one input of an output control device 38.

Error flags from the error flag control device 25 are also supplied to a segment delay device 39, the output of which is connected to the second input of the output control device 38 and also to one input of a 2:1 selector 40. The second input of the selector 40 is connected to an input terminal 41 which is used for resetting the error flag. The output control device 38 supplies control signals to the selectors 32 and 40. The output of the selector 40 is connected to an output terminal 42 from which output error flags are derived.

The clock and control signal regenerator 23 has outputs connected to the inner code correction and error flag generator 22, the CRC device 24, the group delay device 27, the selector 28, the group delay device 35, the selector 36, the segment delay device 31, and the segment delay device 39.

In operation, the input data segments are supplied by way of the input terminal 20 to the synchronizing signal location and address detection device 21 which supplies the synchronizing signals and the addresses to the clock and control signal regenerator 23, which in turn supplies timing signals to control the timing of the other operations in the decoder. The inner code correction and error flag generator 22 operates, so far as possible, to correct errors in each sub-block and supplies error flags to the error flag control device 25 when appropriate. The data output from the inner code corrector and error flag generator 22 is also supplied to the CRC device 24 which performs the CRC. If the CRC is valid, the CRC device 24 controls the error flag control device 25 so that the error flags are not passed on, but if the CRC is not valid, then the error flags are passed by the error flag control device 25.

Data is constantly cycled around the loop formed by the exclusive-OR device 26 and the group delay device 27. This loop forms, at the end of the data segment, the vertical parity syndrome group.

Likewise the error flags are cycled around the loop formed by the exclusive-OR device 34 and the group delay device 35. The output of the group delay device 35 indicates which data groups require vertical parity correction, and also shows where correction is not possible due to more than one data word within the vertical parity check group being in error.

At the end of a data segment, the control signals route the outputs of the group delay devices 27 and 35 via the selectors 28 and 36 to the group delay devices 29 and 37, respectively. The group delay devices 29 and 37 then contain the vertical parity syndrome group and error flags, respectively. At this time, the group delay devices 29 and 37 are cleared by control signals prior to the entry of data and error flag signals from the next data segment.

The data output from the segment delay device 31 when not in error is routed through the selector 32 to the output terminal 33. When the error flag output from the segment delay device 39 indicates a data word in error, the output from the group delay device 37 is interrogated to find out whether the error is correctable by the VPC. If not, then no action is taken and the data and error flags are routed through to the output terminals 33 and 42, respectively, the error flags indicating the need for subsequent concealment.

If the error is correctable, then the output control device 38 operates such that an exclusive-OR operation by the exclusive-OR device 30 on the data from the segment delay device 31 and the syndrome from the group delay device 29 corrects the data and the corrected output is selected by the selector 32 for supply to the output terminal 33. In addition, the error flag associated with that word is cancelled by the output control device 38 activating the selector 40 to remove that error flag.

At this point it should perhaps be mentioned that although in the preceding description it has been assumed that error flags are associated with words, this arrangement does require a fairly substantial amount of storage. In an alternative arrangement, therefore, each error flag is associated with an entire data sub-block. This substantially lowers the storage requirements and also lowers the required operating speeds.

Figure 5:
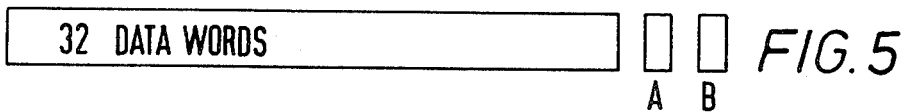
FIG. 5 shows part of the format of FIG. 1 in more detail.

Slightly more detail will now be given of the inner code, which as noted above is the modified Hamming code known as a b-adjacent code. FIG. 5 shows the format of a data sub-block in the data segment. As previously mentioned, the sub-block comprises 32 data words, each being an 8-bit word representing a sample, and 16 ICPBs. The ICPBs are organised into two 8-bit words, these being the 33rd and 34th words in the sub-block and being referred to herein as word A and word B. Word A is an 8-bit scrambled parity check, and word B is an 8-bit parity check.

The manner of generating the word A and the word B in the encoder of FIG. 3 will be described below with reference to FIGS. 6 and 7, and analogous methods are used in the decoder of FIG. 5 to perform the inner code correction. This correction is operative such that if only a single word in the data sub-block is in error, the syndrome formed from word B gives the pattern of the error, and word A can be used to indicate the position of the error, and so indicate where the syndrome which has been generated is to modify the 32-word sub-block.

Figure 6:
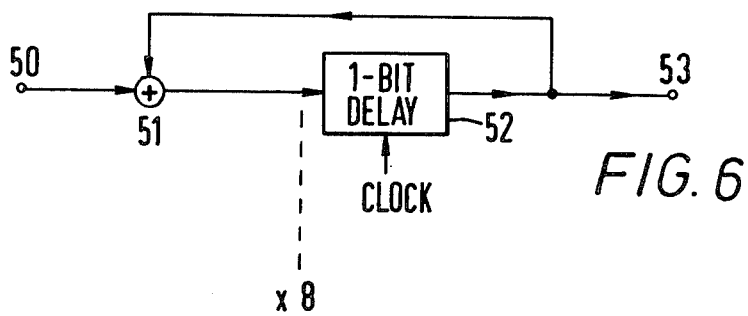
FIG. 6 shows part of the encoder of FIG. 3 in more detail.

Referring now to FIG. 6, it is convenient first to consider the generation of the word B. The necessary arrangement comprises eight similar paths, each comprising an input terminal 50 connected to one input of an exclusive-OR gate 51, the output of which is connected to a 1-bit delay device 52 controlled by a clock pulse signal. The output of the delay device 52 is connected back to the second input of the exclusive-OR gate 51 and also to an output terminal 53. In operation, bit 0 of each data word in the sub-block is successively supplied to the input terminal 50, and likewise the other seven bits of each data word in the sub-block are applied to respective input terminals of respective like paths. The result is that the bits in the corresponding positions in the 32 data words in the sub-block are modulo-2 added and the required 8-bit parity check word B is developed at the output terminals 53.

Figure 7:
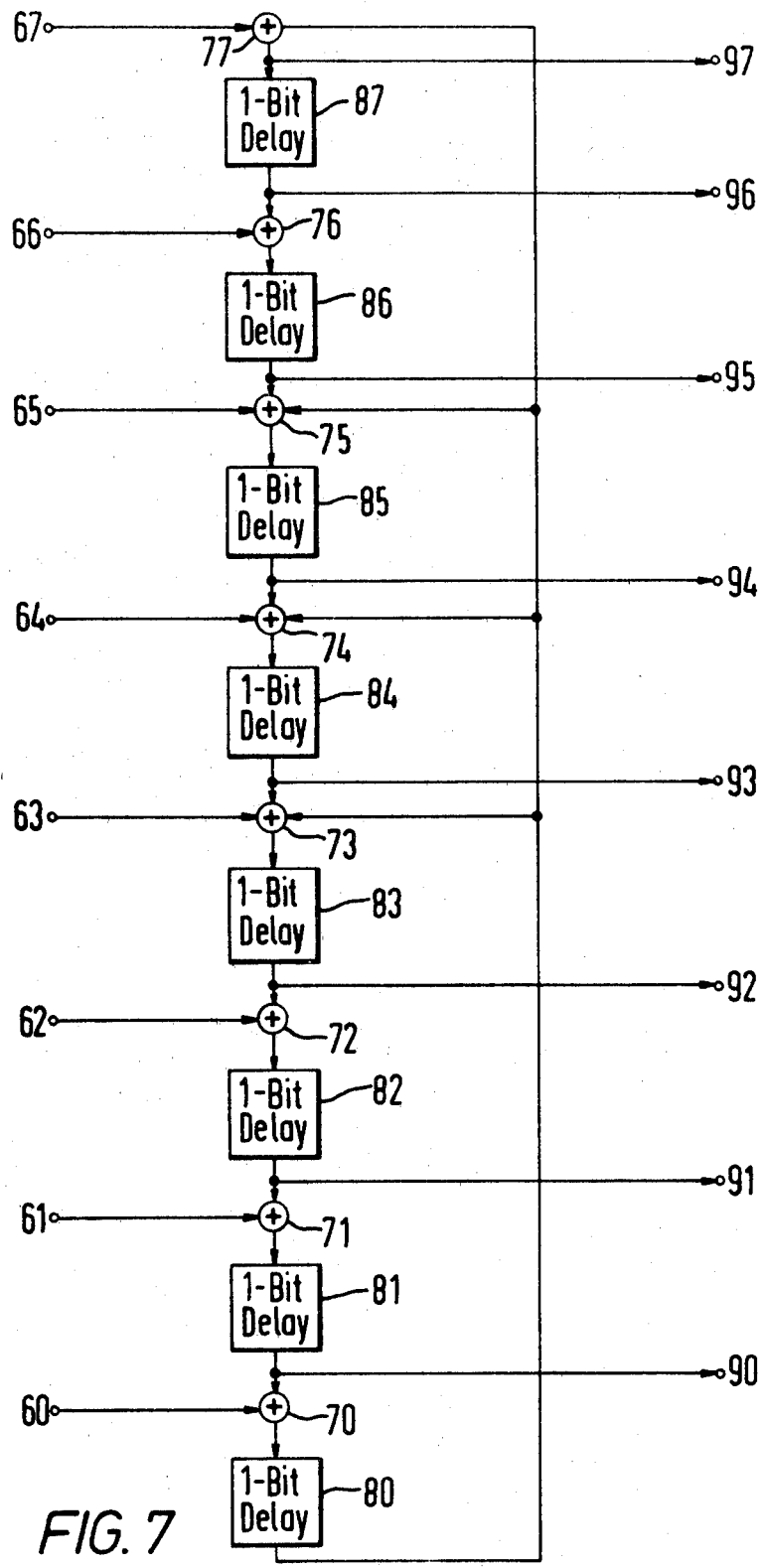
FIG. 7 shows another part of the encoder of FIG. 3 in more detail.

Referring now to FIG. 7, the word A is generated in a kind of feedback shift register arrangement. The arrangement comprises 8 input terminals 60 to 67 to which the respective bits 0 to 7 of each of the 32 data words and the word B in the sub-block are respectively and successively applied. The input terminals 60 to 67 are respectively connected to exclusive-OR devices 70 to 77 each of which has an output connected to a respective 1-bit delay device 80 to 87 and to a respective output terminal 90 to 97. Additionally, there is a feedback path extending from the output of the delay device 80 to third input terminals of the exclusive-OR devices 73, 74, 75 and 77. The effect of these feedbacks is to generate a form of primitive polynomial such that in the case of a single error in the 32 data words or the word B in the data sub-block, the word A can be used to identify the position of that error. Assuming then that the error is not in the word B, the word B provides the syndrome with which the word in error can be modified and corrected.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of transmitting digital television signals comprising the steps of:
    forming data words representing a digital television signal into successive data segments, each said data segment comprising a plurality of data blocks, each said data block comprising a plurality of data sub-blocks, and each said data sub-block comprising a plurality of said data words;
    generating a respective first error correcting code for each said data sub-block for correcting at least one bit which may be in error in said data sub-block;
    generating a respective error detecting code for each said data block for detecting whether said first error correcting code has corrected all errors in said respective data block;
    generating a respective second error correcting code for each said data segment for correcting at least one data word which may be in error in said data segment; and
    combining said first and second error correcting codes and said error detecting code into said respective data segments for transmission of said digital television signal.

2. A method according to claim 1 wherein said first error correcting code is assembled with and forms part of said respective data sub-block for transmission, said error detecting code is assembled with and forms part of said respective data block for transmission, and said second error correcting code is assembled with and forms part of said respective data segment for transmission.

3. A method according to claim 2 wherein the format of said second error correcting code is the same as that of said data words in said data block and said second error correcting code block contains said respective first error correcting codes and said respective error detecting code.

4. A method according to claim 1 wherein said first error correcting code is a Hamming code.

5. A method according to claim 4 wherein said Hamming code is a b-adjacent code.

6. A method according to claim 1 wherein said error detecting code is a cyclic redundancy check code.

7. A method according to claim 1 wherein said second error correcting code is a parity check code.

8. A method according to claim 1 wherein said error detecting code includes an error correction capability.

9. An error correction encoder for digital television signals, the encoder comprising:
    means for forming data words representing a digital television signal into successive data segments, each said data segment comprising a plurality of data blocks, each said data block, comprising a plurality of data sub-blocks, and each said data sub-block comprising a plurality of said data words;
    first error correcting code means for generating a respective first error correcting code for each said data sub-block for correcting at least one bit which may be in error in said data sub-block;
    error detecting code means for generating a respective error detecting code for each said data block for detecting whether said first error correcting code has corrected all errors in said respective data block;
    second error correcting code means for generating a respective second error correcting code for each said data segment for correcting at least one data word which may be in error in said data segment; and
    means for combining said first and second error correcting codes and said error detecting code into said respective data segments for transmission of said digital television signal.

10. An error correction encoder according to claim 9 in combination with an error correction decoder comprising:
    means for receiving said transmitted digital television signal;
    first means operative in dependence on said respective first error correcting code for correcting at least one bit error in said data sub-block and for flagging to indicate that a correction has been attempted in said data sub-block;
    second means operative in dependence on said error detecting code for detecting any errors remaining in said respective data block after operation of said first means, for flagging said remaining errors, and, if no errors remain, for cancelling flags set by said first means; and
    third means operative in dependence on said second error correcting code for correcting at least one data word error remaining in said data segment, after operation of said second means.

* * * * *